United States Patent
Schott

(10) Patent No.: US 8,164,149 B2
(45) Date of Patent: Apr. 24, 2012

(54) VERTICAL HALL SENSOR

(75) Inventor: Christian Schott, Lussy-sur-Morges (CH)

(73) Assignee: Melexis Technologies SA, Bevaix (CH)

( * ) Notice: Subject to any disclaimer, the term of this patent is extended or adjusted under 35 U.S.C. 154(b) by 288 days.

(21) Appl. No.: 12/623,571

(22) Filed: Nov. 23, 2009

(65) Prior Publication Data

US 2010/0133632 A1   Jun. 3, 2010

(30) Foreign Application Priority Data

Nov. 28, 2008   (CH) ..................... 1882/08

(51) Int. Cl.
H01L 29/82 (2006.01)
H01L 43/00 (2006.01)

(52) U.S. Cl. .................. 257/427; 257/426; 257/653

(58) Field of Classification Search .......... 257/426, 257/427, 653, E23.005, E43.003
See application file for complete search history.

(56) References Cited

U.S. PATENT DOCUMENTS

| 4,829,352 A * | 5/1989 | Popovic et al. ............... 257/426 |
| 4,987,467 A | 1/1991 | Popovic |
| 6,903,429 B2 * | 6/2005 | Berndt et al. ................. 257/414 |
| 7,253,490 B2 * | 8/2007 | Oohira .......................... 257/424 |
| 7,253,601 B2 * | 8/2007 | Ishio .......................... 324/117 H |
| 7,872,322 B2 * | 1/2011 | Schott et al. .................. 257/427 |
| 2006/0011999 A1 | 1/2006 | Schott et al. |
| 2006/0097715 A1 | 5/2006 | Oohira et al. |

FOREIGN PATENT DOCUMENTS

| DE | 10150955 C1 | 6/2003 |
| EP | 0954085 A1 | 11/1999 |
| JP | 2005259803 | 9/2005 |
| JP | 2007027515 A | 2/2007 |
| WO | 03036733 A2 | 5/2003 |
| WO | 2004025742 A1 | 3/2004 |

OTHER PUBLICATIONS

International search report for EP 09 17 6293 dated Oct. 5, 2010.

* cited by examiner

Primary Examiner — Phuc Dang
(74) Attorney, Agent, or Firm — McCorminck, Paulding & Huber LLP

(57) ABSTRACT

A vertical Hall sensor which is integrated in a semiconductor chip has at least 6 electric contacts which are arranged along a straight line on the surface of the semiconductor chip. The electric contacts are wired according to a predetermined rule, namely such that when the contacts are numbered through continuously and repeatedly with the numerals 1, 2, 3 and 4 starting from one of the two outermost contacts, the contacts to which the same numeral is assigned are electrically connected with each other.

14 Claims, 4 Drawing Sheets

VERTICAL HALL SENSOR

CROSS REFERENCE TO RELATED APPLICATIONS

Figure 1:
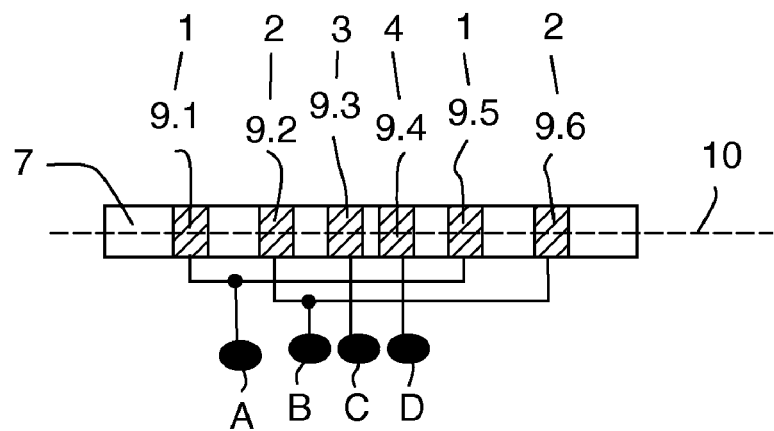

Applicant hereby claims foreign priority under 35 U.S.C §119 from Swiss Application No. 1882/08 filed Nov. 28, 2008, the disclosure of which is herein incorporated by reference.

FIELD OF THE INVENTION

The invention relates to a vertical Hall sensor which is integrated in a semiconductor chip.

BACKGROUND OF THE INVENTION

Such a vertical Hall sensor is a magnetic field sensor which is sensitive to a magnetic field which extends parallel to the surface of the semiconductor chip. The Hall sensor usually consists of an n-doped well which is embedded in a p-doped substrate, or a p-doped well which is embedded in an n-doped substrate. The well typically comprises four or five contacts which are arranged along a straight line and are disposed on the surface of the substrate. Two or three of the four contacts are current contacts which are used to allow a current to flow through the Hall sensor, and two of the other contacts are voltage contacts which are used to tap the Hall voltage which is produced in a magnetic field which extends perpendicular to the direction of the current and perpendicular to the surface of the semiconductor chip.

The most frequently used Hall sensors comprise four contacts or five contacts or, at most, six contacts and are sufficiently known from literature, including patent literature.

One of the most difficult tasks in the development of vertical Hall sensors was, and still is, determining the position and size of the contacts in such a way that the so-called offset of the sensor signal, which is the voltage present between the voltage contacts in the absence of a magnetic field, is as low as possible. This task will become the more difficult the thinner the well embedded in the substrate. This well, which represents the region of the Hall sensor which is sensitive to the magnetic field, is very thin with the current depth of a few micrometers and is becoming thinner and thinner with the progress in the miniaturization of the transistors. This problem therefore needs to be solved anew in each generation of IC technology.

In order to reduce the offset of a Hall sensor, two standard methods are known, which is firstly the orthogonal coupling of at least two Hall sensors, with the contacts of the first Hall sensor being "electrically displaced by 90°" in relation to the contacts of the second Hall sensor, and secondly the "Spinning Current Method", in which the current and voltage contacts of the Hall sensor are exchanged in a cyclic manner. The orthogonal coupling is also known as parallel connection. These methods are known for example from the book "Hall Effect Devices, Magnetic Sensors and Characterization of Semiconductors" by Dr. R. S. Popovic, Adam Hilger, ISBN 0-7503-0096-5 and from EPFL Thesis No. 3134 (2004) by Enrico Schurig. The simultaneous application of both methods is known from WO 03/036733.

SUMMARY OF THE INVENTION

The invention is based on the object of developing a vertical Hall sensor whose offset is as low as possible.

A vertical Hall sensor which is integrated in a semiconductor chip, comprises an electrically conductive well of a first conductivity type which is embedded in an electrically conductive region of a second conductivity type, and electric contacts which are arranged along a straight line on the surface of the electrically conductive well. The number n of the contacts is at least n=6. According to the invention, when the contacts are numbered through continuously and repeatedly with the numerals 1, 2, 3 and 4 starting from one of the two outermost contacts, the contacts to which the same numeral is assigned are electrically connected with each other.

Starting from the middle between the two outermost contacts, the distance between the contacts may increase from contact to contact, for example by a predetermined factor or by a constant value or by a combination of both, i.e. by multiplication with a predetermined factor and addition of a constant value.

Furthermore, starting from the middle between the two outermost contacts, the length of the contacts may increase from contact to contact.

The vertical Hall sensor preferably comprises an electronic circuit configured to operate the vertical Hall sensor according to the spinning current method. The vertical Hall sensor and the electronic circuit are preferably integrated in the same semiconductor chip.

BRIEF DESCRIPTION OF THE DRAWING FIGURES

Figure 2:
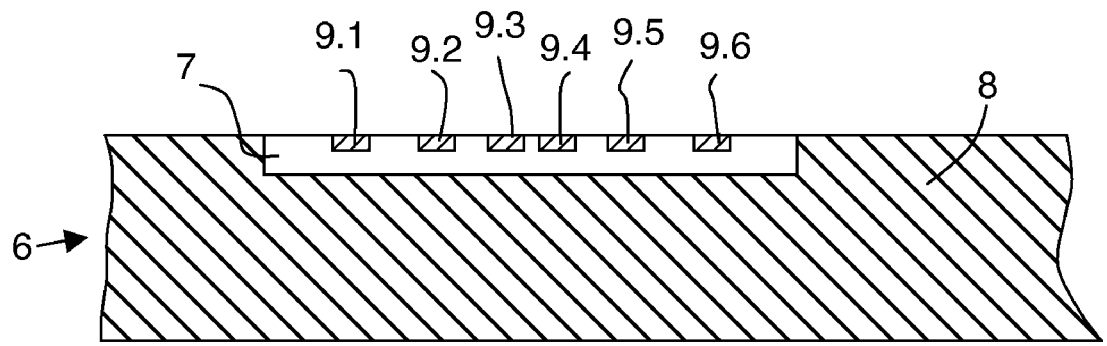
Figure 5:
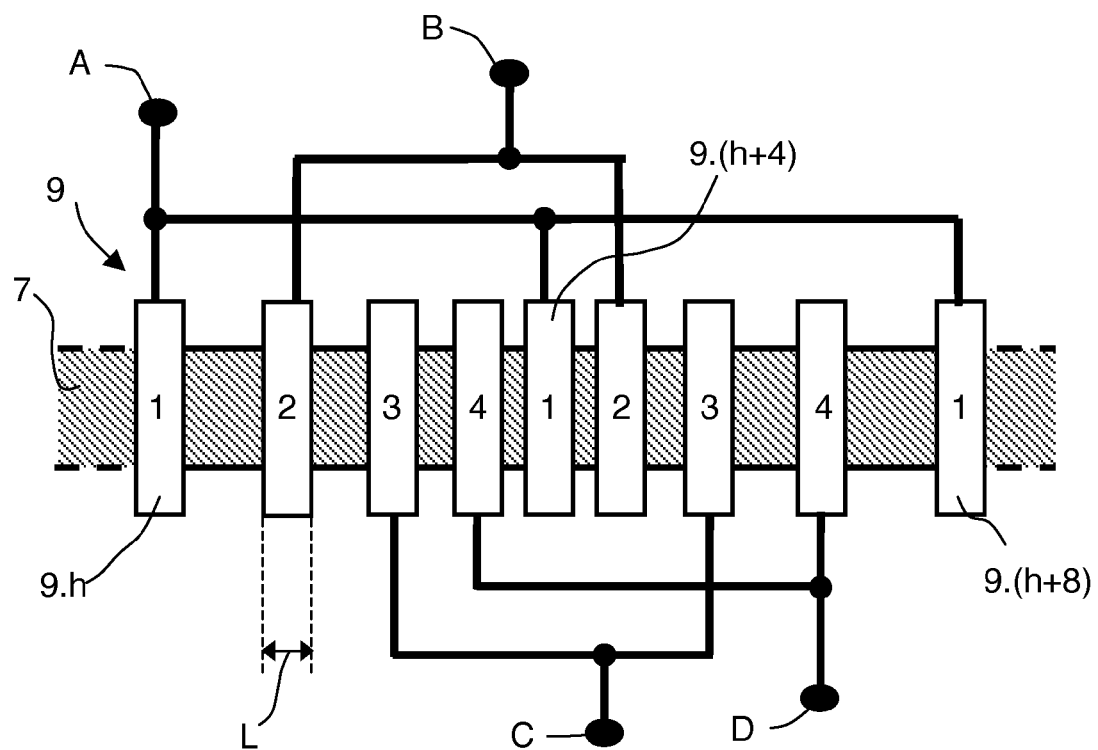
Figure 6:
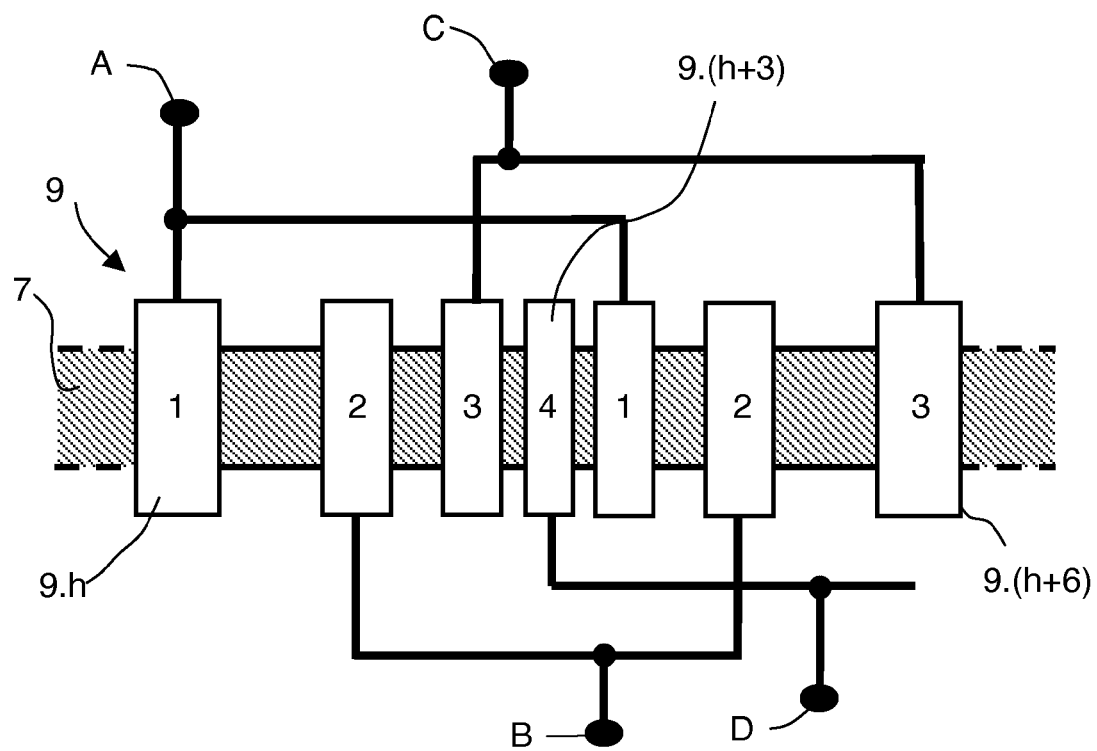
Figure 7:
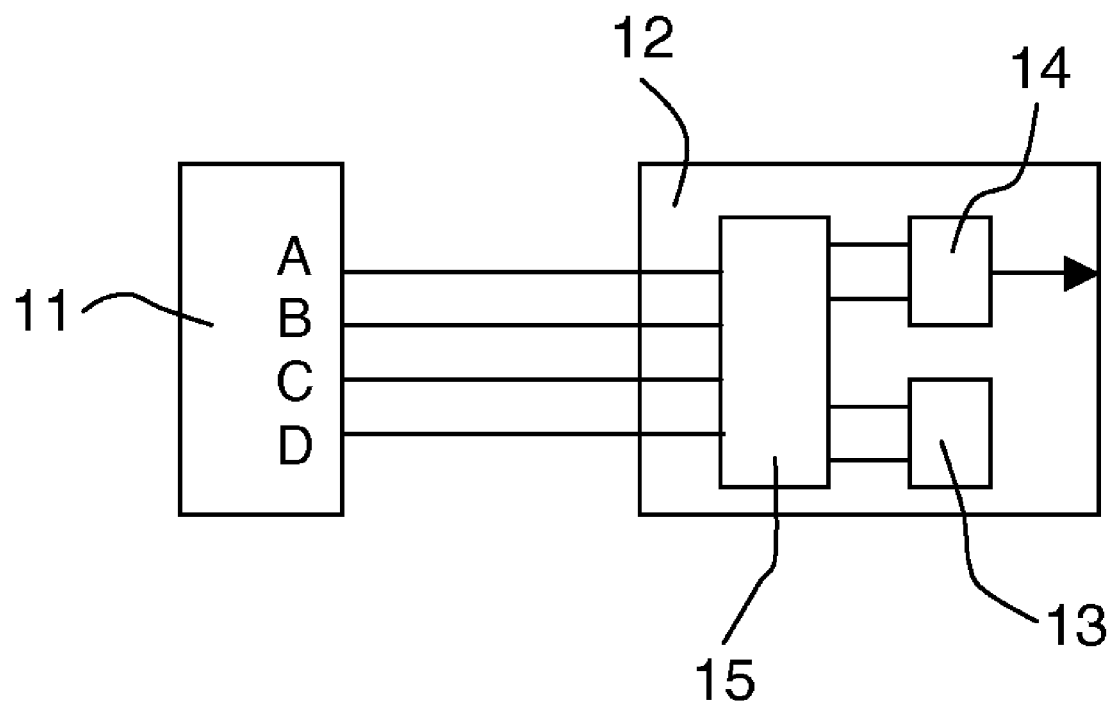

The accompanying drawings, which are incorporated into and constitute a part of this specification, illustrate schematically one or more embodiments of the present invention and, together with the detailed description, serve to explain the principles and implementations of the invention. The figures are not to scale. In the drawings:

FIGS. 1, 2 show a vertical Hall sensor in accordance with the invention in a top view and in a lateral view, FIGS. 3 to 6 show further embodiments of vertical Hall sensors in accordance with the invention, and FIG. 7 shows a vertical Hall sensor and an electronic circuit for operation of the vertical Hall sensor according to the spinning current method.

DESCRIPTION OF THE PREFERRED EMBODIMENTS

FIGS. 1 and 2 show a vertical Hall sensor in a top view and side view, which sensor is integrated in a semiconductor chip 6. The vertical Hall sensor comprises an electrically conductive well 7 of a first conductivity type which is embedded in an electrically conductive region 8 of a second conductivity type, and a number n of contacts 9.1 to 9.$n$ which make contact with the well 7. The entirety of the contacts 9.1 to 9.$n$ will be designated as contacts 9 for the sake of simplicity. Although the number n of the contacts 9 can be n=6 as a minimum and assume any value n≧6, it is advantageously in the range of approx. n=16 to 32. The well 7 preferably consists of n-doped semiconductor material and the region 8 of p-doped semiconductor material. The well 7 is thus electrically insulated from region 8 by a pn-junction. The n contacts 9 are arranged along a straight line 10. The well 7 and especially the contacts 9 are disposed on the surface of the semiconductor chip 6 which is accessible for wiring. The contacts 9 are usually highly doped regions of the first conductivity type which usually have the same width as the well 7. They can also be slightly wider or narrower however. The Hall sensor is sensitive to a magnetic field which extends parallel to the semiconductor chip 6 and perpendicular to the straight line 10 and therefore belongs to the class of vertical Hall sensors. The semiconductor chip 6 further comprises a plurality of integrated electronic elements (not shown) which form an electronic circuit for the operation of the Hall sensor.

The contacts 9 are connected with each other electrically according to a rule in such a way that they form four terminals A, B, C and D which are connected with the electric circuit, with two of the four terminals being used as current terminals in order to supply the Hall sensor with a current, and the other two of the four terminals are used as voltage terminals in order to tap the Hall voltage. The rule for connecting the contacts 9 is the following: When the contacts 9, originating from one of the two outermost contacts 9.1 or 9.$n$, with contact 9.1 being used for the sake of simplicity, are numbered through in a continuous manner and repeatedly with the four numerals 1, 2, 3 and 4, the contacts 9 which are associated with the same numeral are electrically connected with each other. This allocation can be expressed mathematically by means of the modulo function (mod) as follows:

$$\text{numeral(contact 9.}n\text{)}=[(n-1)\bmod 4]+1 \quad (1),$$

i.e. contact 9.$n$ is associated with numeral $[(n-1) \bmod 4]+1$, because 0 mod 4=0, 1 mod 4=1,
2 mod 4=2, 3 mod 4=3, 4 mod 4=0, 5 mod 4=1, 6 mod 4=2, etc.

The allocation of the numerals 1, 2, 3 and 4 to the contacts 9.1 to 9.6 is shown in FIG. 1 at the top. The respective wiring is shown in FIG. 1 at the bottom.

According to a further rule which relates to its distances, the contacts 9 are arranged along the straight line 10: The distance between the contacts 9 can be constant, but the following is preferred:
Starting from the middle between the outermost contacts 9.1 and 9.$n$, the distance between adjacent contacts 9 increases from contact to contact. The increase can occur according to different rules, of which three will be presented.

If the number n of contacts 9 is an even number, the quantity A determines the distance between the two contacts 9.(n/2) and 9.(n/2+1) in the middle. If the number of contacts 9 is an odd number, the quantity A determines the distance between the contact 9.(n/2+½) in the middle and the adjacent contact 9.(n/2−½) as well as the distance between the contact 9.(n/2+½) in the middle and the adjacent contact 9.(n/2+3/2), which are of the same size.

Rule 1

Starting from the only contact in the middle (when n is an odd number) or the two contacts in the middle (when n is an even number), the distance between adjacent contacts increases by a constant value K from contact to contact in the direction towards the outermost contacts 9.1 and 9.$n$.
This rule is shown in FIG. 1 for n=6. The distance between the two contacts 9.3 and 9.4 in the middle is A. The distance between the two contacts 9.2 and 9.3 and the distance between the two contacts 9.4 and 9.5 is A+K. The distance between the two contacts 9.1 and 9.2 and the distance between the two contacts 9.5 and 9.6 is A+2*K.

Rule 2

Starting from the only contact in the middle (when n is an odd number) or the two contacts in the middle (when n is an even number), the distance between adjacent contacts increases by a constant factor L from contact to contact in the direction towards the outermost contacts 9.1 and 9.$n$.
The following is obtained for n=6: The distance between the two contacts 9.3 and 9.4 in the middle is A. The distance between the two contacts 9.2 and 9.3 and the distance between the two contacts 9.4 and 9.4 is L*A. The distance between the two contacts 9.1 and 9.2 and the distance between the two contacts 9.5 and 9.6 is L*(L*A)=L$^2$*A.

Rule 3

Starting from the only contact in the middle (when n is an odd number) or the two contacts in the middle (when n is an even number), the distance between adjacent contacts increases at first by a constant factor L from contact to contact in the direction towards the outermost contacts 9.1 and 9.$n$, and a constant value K is added to the same.
The following is obtained for n=6: The distance between the two contacts 9.3 and 9.4 in the middle is A. The distance between the two contacts 9.2 and 9.3 and the distance between the two contacts 9.4 and 9.4 is L*A+K. The distance between the two contacts 9.1 and 9.2 and the distance between the two contacts 9.5 and 9.6 is L*(L*A+K)+K.

FIGS. 3 to 6 show further embodiments which all have the same configuration, but differ from one another in certain features. These drawings show the well 7, the middle region of the vertical Hall sensor and, illustrated by broken lines, how the system progresses when there are more than the contacts 9 shown with the unbroken line. Each contact 9 is associated with a numeral 1, 2, 3 or 4 according to the above rule (1). The contacts 9 who are associated with the same numeral are electrically connected with each other and guided to one of the four connections A, B, C or D.

Figure 3:
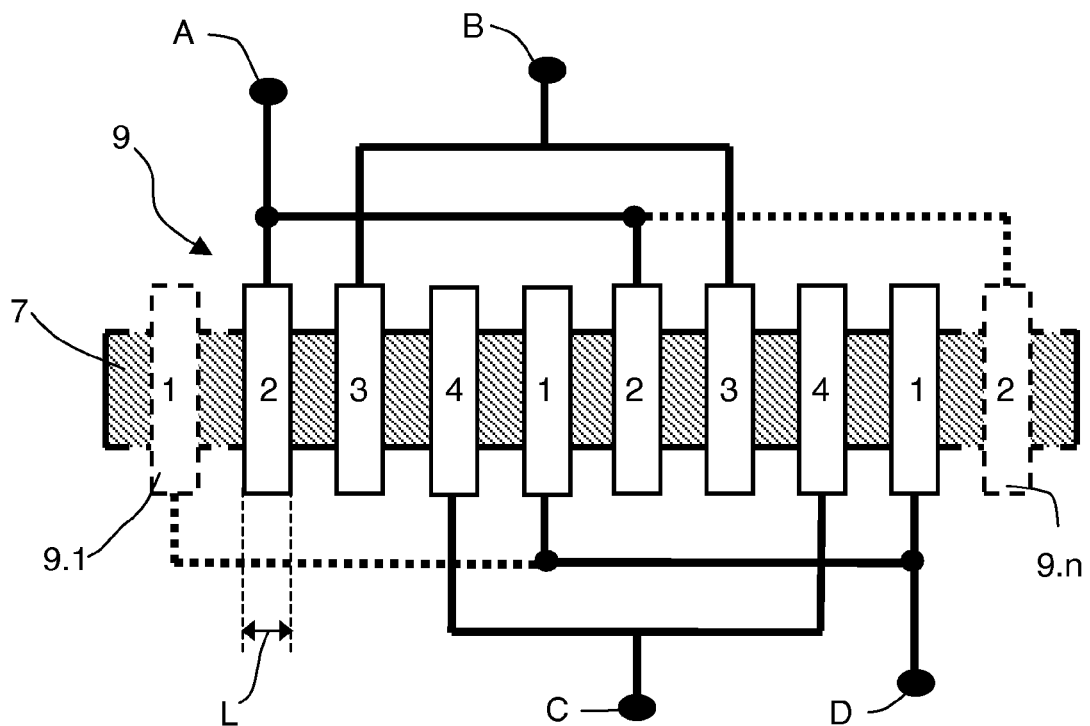
Figure 4:
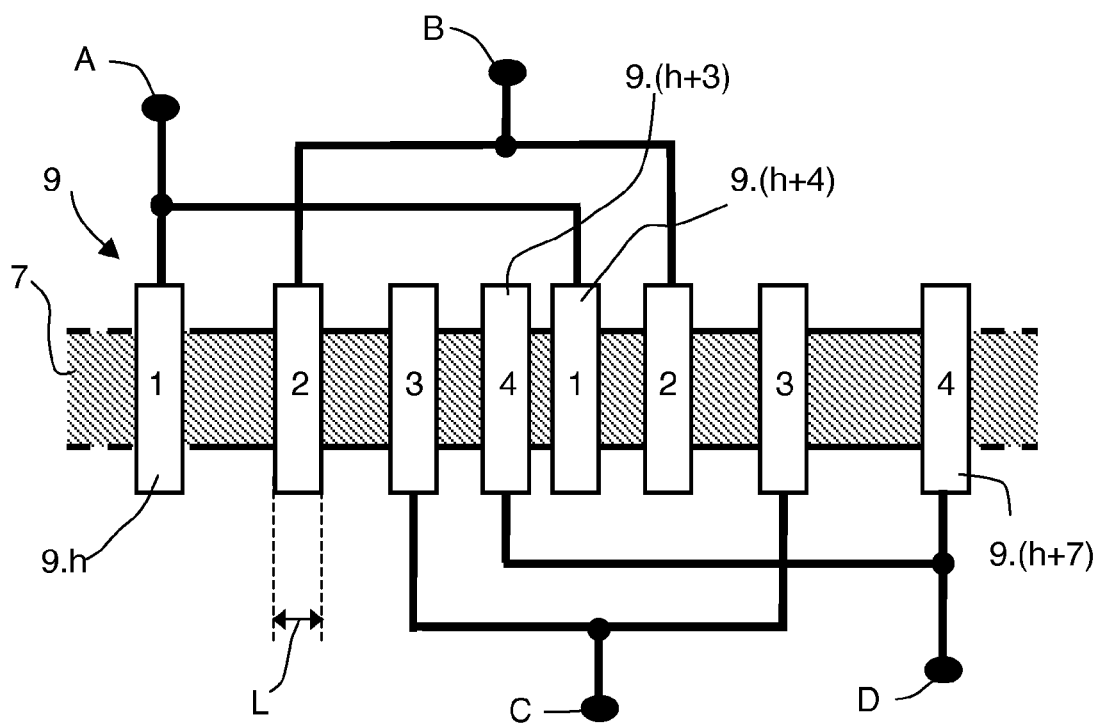

The common aspect in the examples of FIGS. 3 to 5 is that all contacts 9 have the same length L.

FIG. 3 shows a vertical Hall sensor in which the distance between the contacts 9 has a constant value. The drawing also shows the two end regions of the vertical Hall sensor with the two outermost contacts 9.1 and 9.$n$. The number n of the contacts 9 can have any desired value of n≧6, with the value n being an even or odd number. In the example, the numeral 1 is associated with the outermost left contact 9.1 and the numeral 2 to the outermost right contact 9.$n$. The numeral to be associated to these contacts 9.1 or 9.$n$ depends on the value n. In the case shown in FIG. 3, the outermost left contact 9.1 must be connected with those contacts 9 to which the numeral 1 is assigned, and the outermost right contact 9.$n$ must be connected with those contacts to which the numeral 2 is assigned.

FIG. 4 shows a vertical Hall sensor in which in the middle two contacts are arranged at a predetermined distance from each other and in which, starting from the middle, the distance between the contacts 9 increases from contact to contact in both directions towards the end regions. The number n of the contacts is preferably an even number. The two contacts in the middle are designated with the reference numeral 9.(h+3) and 9.(h+4). The number h is only a placeholder, but depends on the number n of contacts 9.

FIG. 5 shows a vertical Hall sensor in which a single contact is arranged in the middle and in which, starting from said middle contact, the distance between the contacts 9 increases from contact to contact in both directions towards the end regions. The number of contacts is preferably an odd number. The middle contact is designated with reference numeral 9.(h+4).

FIG. 6 shows a vertical Hall sensor which is similar to the vertical Hall sensor shown in FIG. 5, but with the difference that the length of the contacts 9 increases with rising distance from the middle contact 9.(h+4).

If the number n of the contacts is an odd number, the contacts 9 are preferably arranged symmetrically in the well 7 with respect to the only middle contact. If the number n of the contacts is an even number, the contacts 9 are preferably arranged symmetrically in the well 7 with respect to the two middle contacts.

The vertical Hall sensors in accordance with the invention are preferably operated with the spinning current method, in which the current and voltage contacts are exchanged in a cyclic manner in two or four phases. The spinning current method is well known from the literature and is described for example in the paper of P J A Munter, "A low-offset spinning-current Hall plate", Sensors and Actuators A21-A23 (1990) 743-746 as well as in WO 03/036733, which are explicitly referred to and incorporated by reference. FIG. 7 shows a vertical Hall sensor 11 according to the invention with the four terminals A, B, C and D, that are connected by electrical conductors with an electronic circuit 12, that enables the operation of the Hall sensor 11 with the spinning current method. The electronic circuit 12 comprises a current source 13, a voltmeter 14, a multiplexer 15 and further (not shown) circuit blocks. The multiplexer 15 serves to connect two of the four terminals A, B, C and D with the two terminals of the current source 13 and the other two of the four terminals A, B, C and D with the two terminals of the voltmeter 14 in a cyclic manner according to a predetermined spinning current scheme. The Hall sensor 11 and the electronic circuit 12 preferably integrated in the same semiconductor chip.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except by the spirit of the appended claims and their equivalents.

What is claimed is:

1. A vertical Hall sensor which is integrated in a semiconductor chip, comprising
   an electrically conductive well of a first conductivity type which is embedded in an electrically conductive region of a second conductivity type, and
   a number, n, of electric contacts which are arranged along a straight line on a surface of the electrically conductive well, wherein
   the number n of the contacts is at least n=6, and, when the contacts are numbered through continuously and repeatedly with the numerals 1, 2, 3 and 4 starting from one of the two outermost contacts, the contacts to which the same numeral is assigned are directly electrically connected with each other.

2. The vertical Hall sensor according to claim 1, wherein, starting from the middle between the two outermost contacts, the distance between the contacts increases from contact to contact.

3. The vertical Hall sensor according to claim 2, wherein said distance increases by a predetermined factor.

4. The vertical Hall sensor according to claim 2, wherein said distance increases by a constant value.

5. The vertical Hall sensor according to claim 2, wherein said distance is increased by a predetermined factor and a constant value is added thereto.

6. The vertical Hall sensor according to claim 1, wherein, starting from the middle between the two outermost contacts, the length of the contacts increases from contact to contact.

7. The vertical Hall sensor according to claim 2, wherein, starting from the middle between the two outermost contacts, the length of the contacts increases from contact to contact.

8. The vertical Hall sensor according to claim 3, wherein, starting from the middle between the two outermost contacts, the length of the contacts increases from contact to contact.

9. The vertical Hall sensor according to claim 4, wherein, starting from the middle between the two outermost contacts, the length of the contacts increases from contact to contact.

10. The vertical Hall sensor according to claim 5, wherein, starting from the middle between the two outermost contacts, the length of the contacts increases from contact to contact.

11. The vertical Hall sensor according to claim 1, further comprising an electronic circuit configured to operate the vertical Hall sensor according to the spinning current method.

12. The vertical Hall sensor according to claim 2, further comprising an electronic circuit configured to operate the vertical Hall sensor according to the spinning current method.

13. The vertical Hall sensor according to claim 6, further comprising an electronic circuit configured to operate the vertical Hall sensor according to the spinning current method.

14. The vertical Hall sensor according to claim 7, further comprising an electronic circuit configured to operate the vertical Hall sensor according to the spinning current method.

* * * * *